(12) United States Patent
Drane et al.

(10) Patent No.: US 8,993,891 B2
(45) Date of Patent: Mar. 31, 2015

(54) LIFT AND PIVOT GROMMET

(71) Applicant: Thomas & Betts International, Inc., Wilmington, DE (US)

(72) Inventors: Mark R. Drane, Germantown, TN (US); Cong T. Dinh, Collierville, TN (US); Bobby N. Norwood, Leoma, TN (US)

(73) Assignee: Thomas & Betts International, Inc., Wilmington, DE (US)

( * ) Notice: Subject to any disclaimer, the term of this patent is extended or adjusted under 35 U.S.C. 154(b) by 53 days.

(21) Appl. No.: 13/783,443

(22) Filed: Mar. 4, 2013

(65) Prior Publication Data

US 2014/0000959 A1    Jan. 2, 2014

Related U.S. Application Data

(60) Provisional application No. 61/665,483, filed on Jun. 28, 2012.

(51) Int. Cl.
| | | |
|---|---|---|
| *H01B 17/58* | (2006.01) | |
| *H05K 5/02* | (2006.01) | |
| *H02G 3/18* | (2006.01) | |

(52) U.S. Cl.
CPC ............ *H05K 5/0239* (2013.01); *H02G 3/185* (2013.01)
USPC ......... 174/152 G; 174/153 G; 16/2.1; 248/56

(58) Field of Classification Search
USPC ......... 174/152 G, 153 G; 16/2.1, 2.2; 248/56; 439/604; 277/606
See application file for complete search history.

(56) References Cited

U.S. PATENT DOCUMENTS

| | | | |
|---|---|---|---|
| 3,433,886 A | 3/1969 | Myers | |
| 3,646,244 A | 2/1972 | Cole | |
| 3,992,070 A | 11/1976 | Dunn et al. | |
| 4,125,238 A * | 11/1978 | Tanaka | 248/56 |
| 4,551,577 A | 11/1985 | Byrne | |
| 4,747,788 A | 5/1988 | Byrne | |
| 4,792,881 A | 12/1988 | Wilson et al. | |
| 4,984,982 A | 1/1991 | Brownlie et al. | |
| 5,023,396 A | 6/1991 | Bartee et al. | |
| 5,342,993 A | 8/1994 | Siems | |
| 5,575,668 A | 11/1996 | Timmerman | |
| 5,594,525 A | 1/1997 | Benker et al. | |
| 6,028,267 A | 2/2000 | Byrne | |
| 6,234,812 B1 | 5/2001 | Ivers et al. | |
| 6,290,518 B1 | 9/2001 | Byrne | |
| 6,610,927 B2 | 8/2003 | Dinh et al. | |
| 6,756,543 B1 | 6/2004 | Kaloustian | |
| 6,835,890 B2 | 12/2004 | Dinh et al. | |
| 7,166,798 B2 | 1/2007 | Cole | |
| 7,276,662 B2 | 10/2007 | Drane | |
| 7,285,733 B2 * | 10/2007 | Bowman | 174/480 |

(Continued)

*Primary Examiner* — Dhirubhai R Patel
(74) *Attorney, Agent, or Firm* — Snyder, Clark, Lesch & Chung, LLP (57) ABSTRACT

A grommet assembly includes a liner, a grommet body, and a lid. The liner is configured to be secured within a hole in a deck surface. The grommet body is configured to move longitudinally within the liner between an extended position and a withdrawn position. The lid is attached to the grommet body in a pivoting configuration and is configured to secure a plug of an outdoor electrical cord fed through the liner from under the deck surface. The lid pivots between a closed position and an open position that permits access to the plug from above the deck surface when the grommet body is in the extended position.

18 Claims, 13 Drawing Sheets

(56) References Cited

U.S. PATENT DOCUMENTS

| | | |
|---|---|---|
| 7,605,330 B1 * | 10/2009 | Black et al. .............. 174/54 |
| 7,614,889 B1 | 11/2009 | Black et al. |
| 7,626,120 B1 | 12/2009 | Golden et al. |
| 7,674,119 B1 | 3/2010 | McCarthy |
| 8,097,805 B2 | 1/2012 | Drane et al. |
| 8,772,649 B1 * | 7/2014 | Gretz .............. 174/480 |
| 2011/0117760 A1 | 5/2011 | Winstanley et al. |
| 2011/0240363 A1 | 10/2011 | Dinh |

* cited by examiner

LIFT AND PIVOT GROMMET

CROSS-REFERENCE TO RELATED APPLICATION

This application claims priority under 35 U.S.C. §119, based on U.S. Provisional Patent Application No. 61/665,483, filed Jun. 28, 2012, the disclosure of which is hereby incorporated by reference herein.

BACKGROUND OF THE INVENTION

In decks and other outdoor environments it is often desired to have access to electrical outlets or other electrical connections in places located a distance from standard wall outlets. In order to safely accommodate such situations, floor boxes are typically used. These boxes may be located in the floor near or at a desired location.

DETAILED DESCRIPTION OF PREFERRED EMBODIMENTS

The following detailed description refers to the accompanying drawings. The same reference numbers in different drawings may identify the same or similar elements.

According to an implementation described herein, an assembly provides an electrical connection port, on the surface of a wooden or composite outdoor deck, using an outdoor electrical extension cord. In one implementation, a grommet assembly may include a liner, a grommet body, and a lid. The liner may be configured to be secured within a hole in the deck surface. The grommet body may be configured to move longitudinally within the liner between an extended position and a withdrawn position. The lid may be attached to the grommet body in a pivoting configuration and may be configured to secure a plug of an outdoor electrical cord fed through the liner from under the deck surface. The lid may be configured to pivot between a closed position and an open position that permits access to the plug from above the deck surface when the grommet body is in the extended position.

Figure 1:
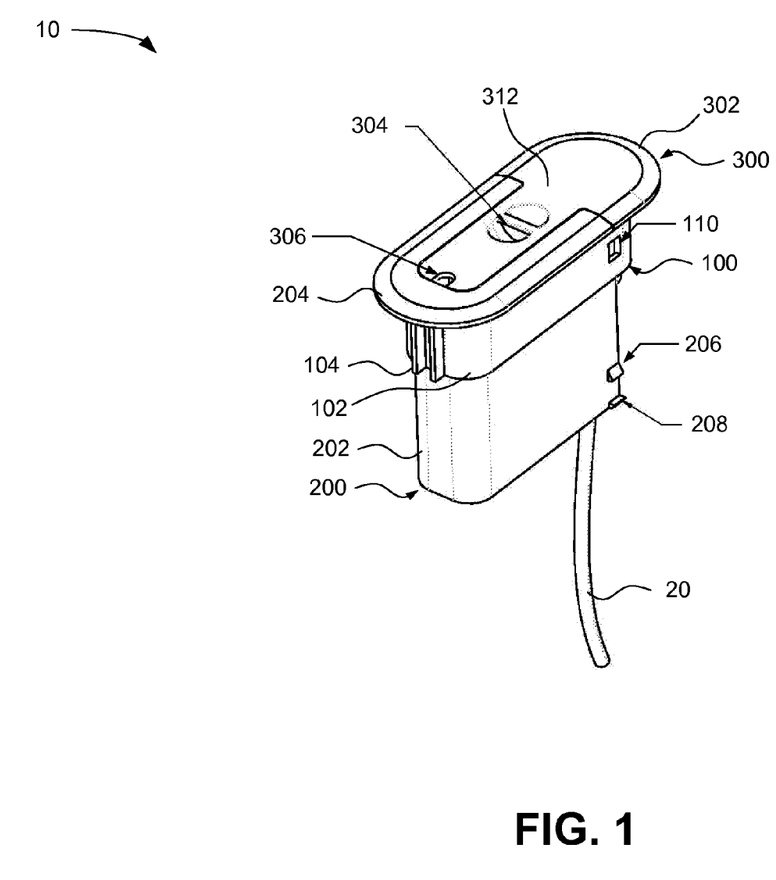
FIG. 1 provides a side perspective view of a deck grommet assembly with a lid in a closed position according to an implementation described herein.
Figure 2:
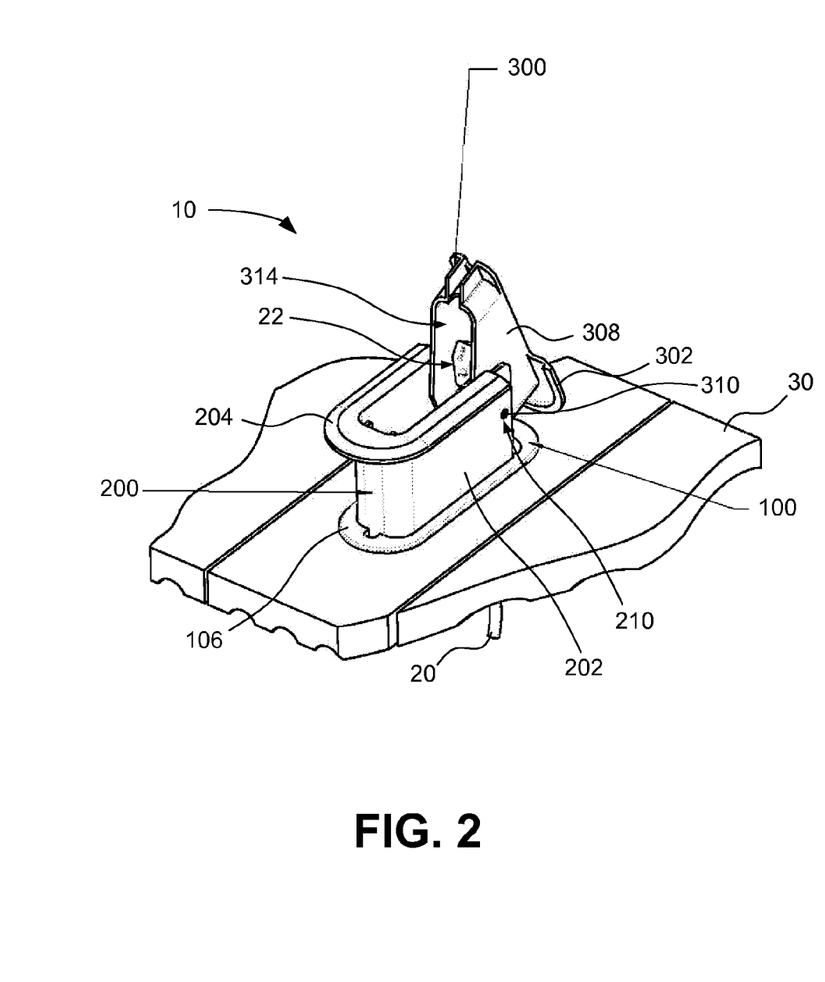
FIG. 2 provides a side perspective view of the deck grommet assembly of FIG. 1 installed in a deck surface and with the lid in an open position.
Figure 3:
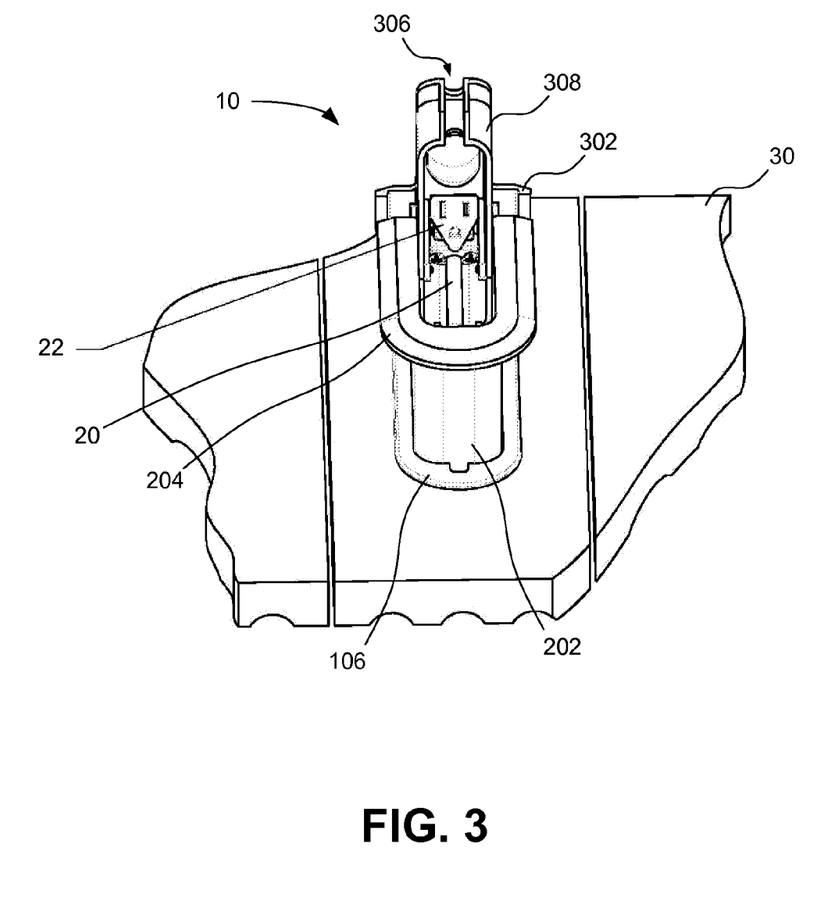
FIG. 3 provides a front perspective view of the deck grommet assembly of FIG. 1 installed in a deck surface and with the lid in an open position.

FIG. 1 provides a side perspective view of a deck grommet assembly 10 with a lid in a closed position, according to an implementation described herein. FIGS. 2 and 3 provide a side perspective view and a front perspective view, respectively, of deck grommet assembly 10 installed in a deck surface 30 and with pivoting lid 300 in an open position. Referring collectively to FIGS. 1-3, generally, grommet assembly 10 is configured to be inserted into a hole in a deck surface 30 to secure a plug from an electrical cord 20 under deck surface 30. Referring to FIG. 1, assembly 10 includes a liner 100, a grommet body 200, and a pivoting lid 300.

Liner 100 may be secured to deck surface 30 within an opening in deck surface 30. Liner 100 generally provides a tube-like structure through which grommet body 200 may be raised/lowered. Liner 100 may include a wall 102 that may be inserted into a corresponding opening in deck surface 30. In one implementation, shown in FIG. 1, wall 102 may include a set of spacers 104 to permit liquid runoff along an outside surface of liner 100. A flange 106 (FIG. 2) may extend laterally from a top edge of wall 102 to prevent insertion of liner 100 through the opening in deck surface 30. Screws 108 (FIG. 4) or another type of fastener may be used to anchor liner 100 to deck surface 30. In one implementation, flange 106 may include a recess to permit screws 108 to be installed at an angle and below the height of flange 106.

Grommet body 200 may generally include one or more walls 202 that form a channel-like structure that may be raised/lowered within liner 100 and that may support pivoting lid 300. In implementations described herein, walls 202 may generally form a u-shaped channel with an open side to accommodate attachment and movement of pivoting lid 300. Grommet body 200 may include an open bottom to allow extension cord 20 (e.g., an outdoor electrical extension cord) to be fed from under deck surface 30 and secured to pivoting lid 300. A flange 204 may extend laterally from a top edge of wall 202 to prevent insertion of grommet body 200 completely through liner 100. In a lowered position, as shown in FIG. 1, grommet body 200 is generally below the top of deck surface 30 so that only flange 204 and part of pivoting lid 300 are visible.

Liner 100 and grommet body 200 may include a latching mechanism to hold grommet body 200 in a raised position and a stop assembly to prevent grommet body 200 from being completely removed from liner 100. For example, wall 102 of liner 100 may include an aperture 110 that is configured to receive a protrusion 206 on grommet body 200 when grommet body 200 is raised within liner 100. Additionally, a stop 208 may extend laterally beyond the perimeter of wall 202 to engage a bottom edge of wall 102 when grommet body 200 is raised within liner 100.

Pivoting lid 300 may include a flange 302, a finger hold 304, an exit port 306, and a top surface 312. When pivoting lid 300 is in the closed position of FIG. 1, flange 302 and top surface 312 may be aligned in substantially the same plane as flange 204. Flange 204 and flange 302 together prevent insertion of grommet body 200/pivoting lid 300 completely through liner 100. Top surfaces of flange 204 and flange 302 may be sloped to allow liquid runoff from grommet assembly 10. In one implementation, flange 204, flange 302, and top surface 312 may generally form a convex facade to promote runoff. Flange 302 is configured to engage deck surface 30 and/or flange 106 to prevent the opening of pivoting lid 300 when grommet body 200 is not extended upward within liner 100.

Finger hold 304 may include a recess and/or protrusion to allow a user to lift grommet body 200 and pivoting lid 300 within liner 100. Exit port 306 may include a channel that extends along a wall of pivoting lid 300 to allow another electrical cord (e.g., that is plugged into extension cord 20) to exit deck grommet assembly 10. As described further herein, pivoting lid 300 also includes a retention member (e.g., a hook) to secure a female end of extension cord 20. In one implementation, the female end of extension cord 20 is secured so that a plug face of extension cord 20 is angled downward from pivoting lid 300 when pivoting lid 300 is in a closed position.

As shown in FIG. 2, liner 100 is secured within an opening of deck surface 30, and grommet body 200 can be lifted up from deck surface 30 into an extended position. Deck grommet assembly 10 may be positioned as shown in FIG. 2 by, for example, a user lifting up finger hold 304. Protrusion 206 may engage aperture 110 to hold grommet body 200 in the extended position above deck surface 30. In the position shown in FIG. 2, a female plug face 22 of extension cord 20 is angled upward to allow for convenient mating with a male plug (e.g., from another extension cord or electrical device).

Pivoting lid 300 may be inserted within the open side of the u-shaped channel of grommet body 200. Grommet body 200 may include apertures 210 on walls 202 to provide a pivot point for pivoting lid 300. Although shown (e.g., in FIG. 2) as extending through wall 202, in other implementations, apertures 210 may be implemented as recesses that do not extend completely through the thickness of wall 202. Pivoting lid 300 may include a wall 308 extending downward from top portion 312. A top edge of wall 308 and the bottom of top portion 312 may meet to form an enclosure with an opening 314 at the bottom edge of walls 308. Walls 308 may be configured to fit inside the u-shaped channel of grommet body 200 with sufficient clearance to permit pivoting lid 300 to rotate within grommet body 200. A pin 310 may be inserted through a portion of wall 308 and apertures 210 to provide a hinge about which pivoting lid 300 may rotate. Pin 310 may be a separate component or may be integrated as, for example, protrusions extending laterally from wall 308. The length of walls 308 (e.g., extending from the top portion 312 to opening 314) may gradually decrease from a longest portion at one end (e.g., the end including pin 310) to a shortest portion at the other end (e.g., the end including exit port 306).

Figure 4:
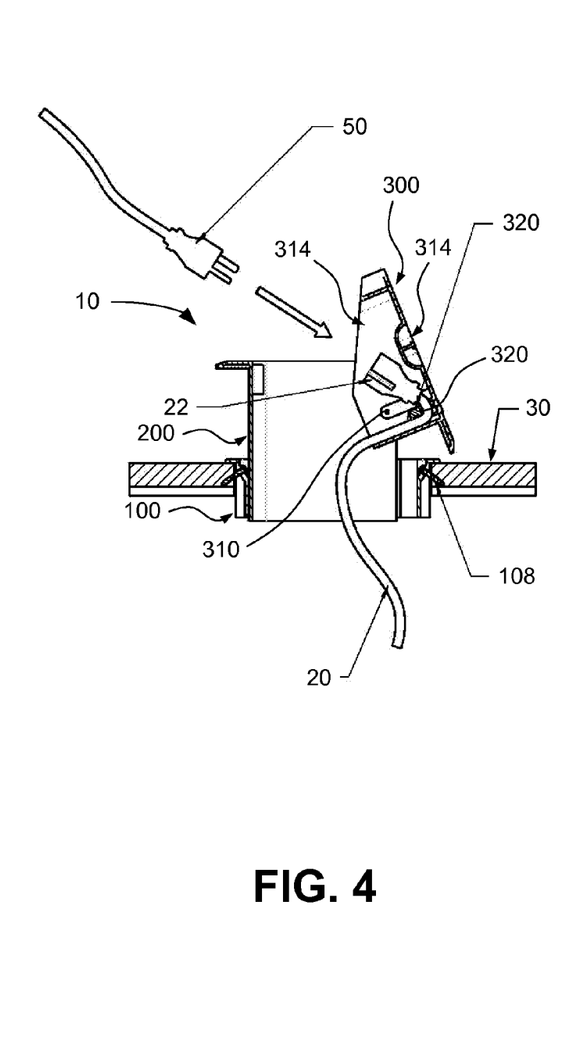
FIG. 4 provides a cross-sectional view of the deck grommet assembly of FIG. 1 with the lid in an open position and an electrical extension cord installed.
Figure 5:
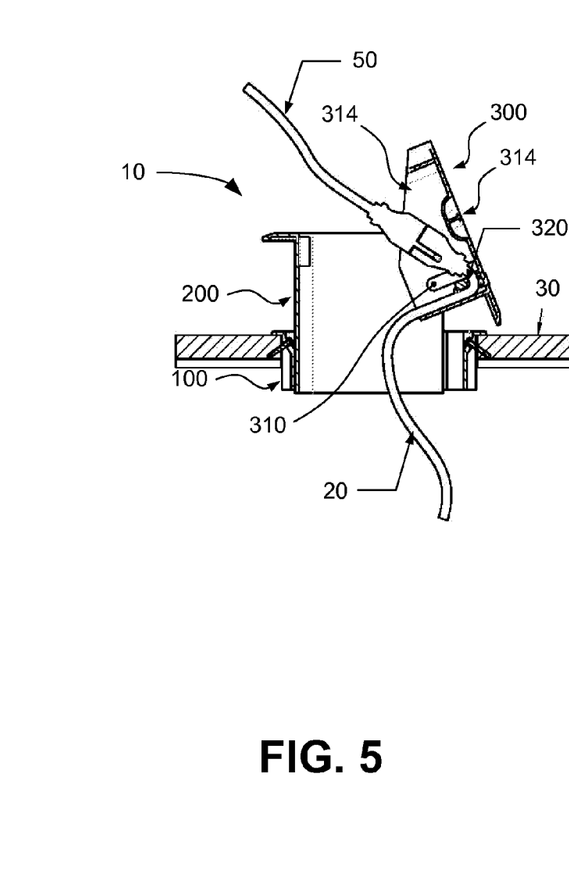
FIG. 5 provides a cross-sectional view of the deck grommet assembly of FIG. 4 with a cord of an electrical device attached.
Figure 6:
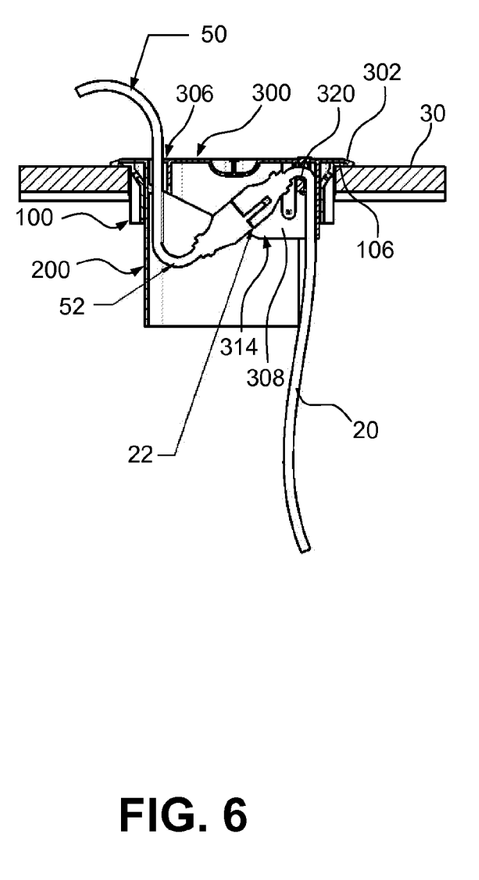
FIG. 6 provides a cross-sectional view of the deck grommet assembly of FIG. 5 with the lid in a closed position.
Figure 7:
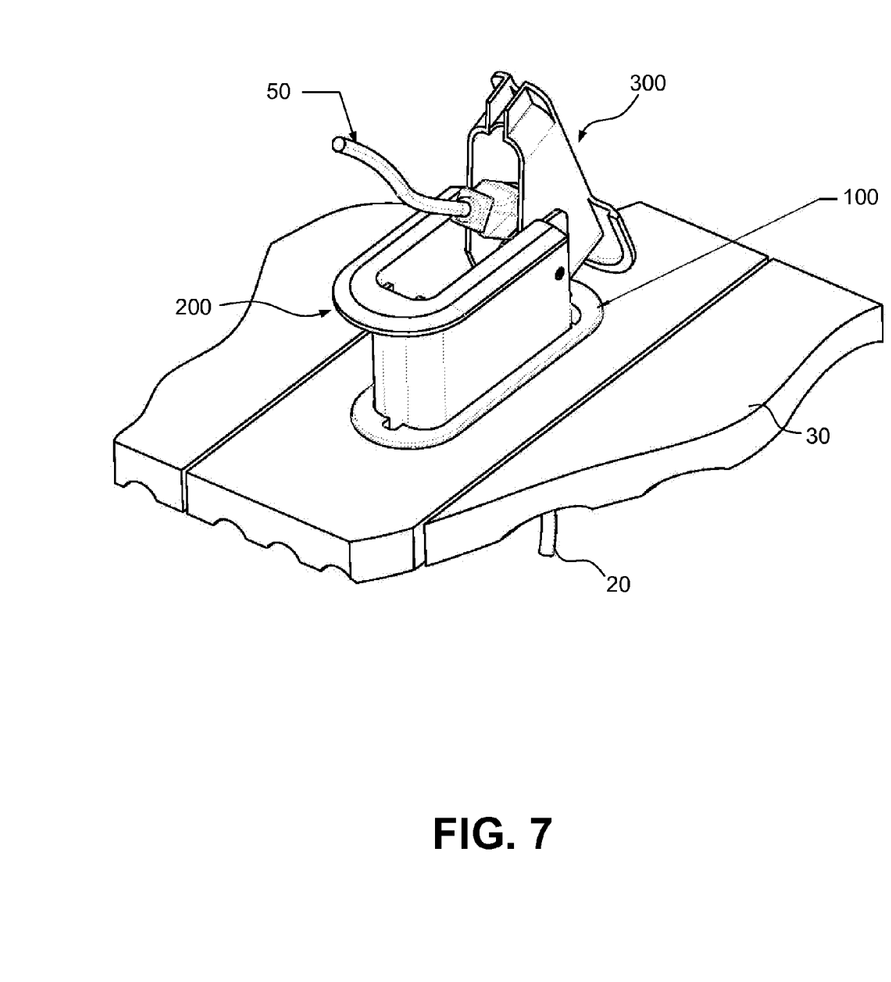
FIG. 7 provides a side perspective view of the deck grommet assembly of FIG. 1 with the lid in an open position and a cord of an electrical device attached.
Figure 8A:
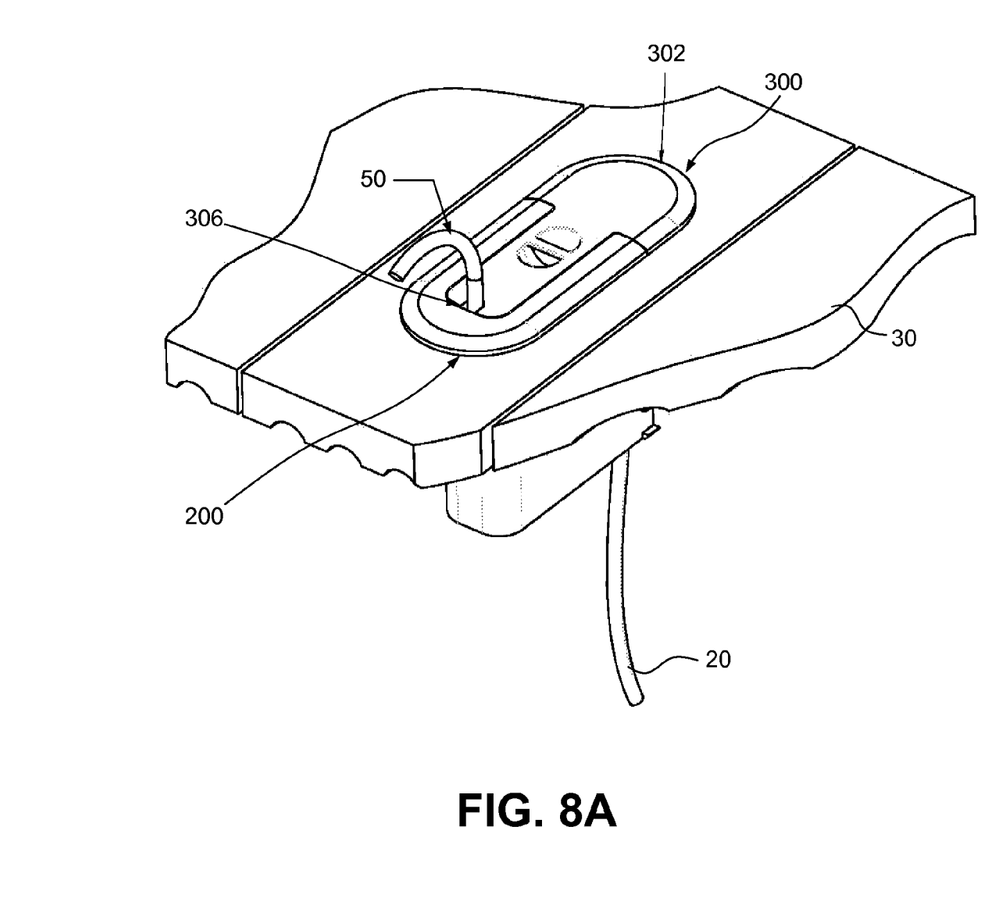
FIG. 8A provides a side perspective view of a deck grommet assembly of FIG. 1 with a lid in a closed position and a cord of an electrical device attached.

FIG. 4 provides a cross-sectional view of deck grommet assembly 10 with pivoting lid 300 in an open position and electrical extension cord 20 installed. FIG. 5 provides a cross-sectional view of deck grommet assembly 10 with extension cord 20 mated to another electrical device and pivoting lid 300 in an open position. FIG. 6 provides a cross-sectional view of deck grommet assembly 10 with extension cord 20 mated to another electrical device and pivoting lid 300 in a closed position. FIGS. 7 and 8A provide perspective views of the configurations of FIGS. 5 and 6, respectively.

Referring collectively to FIGS. 4-8A, extension cord 20 may be installed within deck grommet assembly 10 during or after installation of deck grommet assembly 10 into deck surface 30. Extension cord 20 may be fed through the open bottom of grommet body 200 and opening 314 of pivoting lid 300. A retainer 320 is included within pivoting lid 300 such that a portion of extension cord 20 may be looped over retainer 320 to secure female plug face 22 within pivoting lid 300 and maintain female plug face 22 in the orientation shown, for example, in FIG. 4. In implementations herein, retainer 320 may be an integral piece with pivoting lid 300, or retainer 320 may be a separate piece configured to be secured to pivoting lid 300. The geometry of pivoting lid 300 and the distributed weight of extension cord 20 will generally cause pivoting lid 300 to be self-closing.

Referring to FIG. 4, to use female plug face 22 of extension cord 20, a user can pull (e.g., using finger pull 304) grommet body 200 above deck surface 30 and pivot pivoting lid 300 away from grommet body 200 to reveal female plug face 22. As shown in FIGS. 5 and 7, the user can then plug a male end of their electrical cord 50 (e.g., another extension cord or electrical device) into female plug face 22. After the user's electrical cord 50 is connected to extension cord 20, the user may pivot pivoting lid 300 back to cover the top opening of grommet body 200 and push or drop grommet body 200 back into a withdrawn position within liner 100. As shown in FIGS. 6 and 8A, when pivoting lid 300 is in a closed position, the user's electrical cord 50 can exit pivoting lid 300 through exit port 306 at the top and side of pivoting lid 300.

Still referring to FIG. 6, the shape of pivoting lid 300, the position of female plug face 22, and location of exit port 306 cause the user's electrical cord 50 to form a drip loop 52. Drip loop 52 prevents liquid that may enter exit port 306 and run along electrical cord 50 from traveling up to female plug face 22. Also, as shown in FIG. 6, female plug face 22 is contained within walls 308 and above the face of opening 314 to prevent liquid on the exterior of walls 308 from creeping to female plug face 22. When grommet body 200 is dropped back down into liner 100 in deck surface 30, pivoting lid 300 cannot open due to the shape of the pivoting lid and particularly engagement of flange 302 with the flange 106 and/or deck surface 30.

Figure 8B:
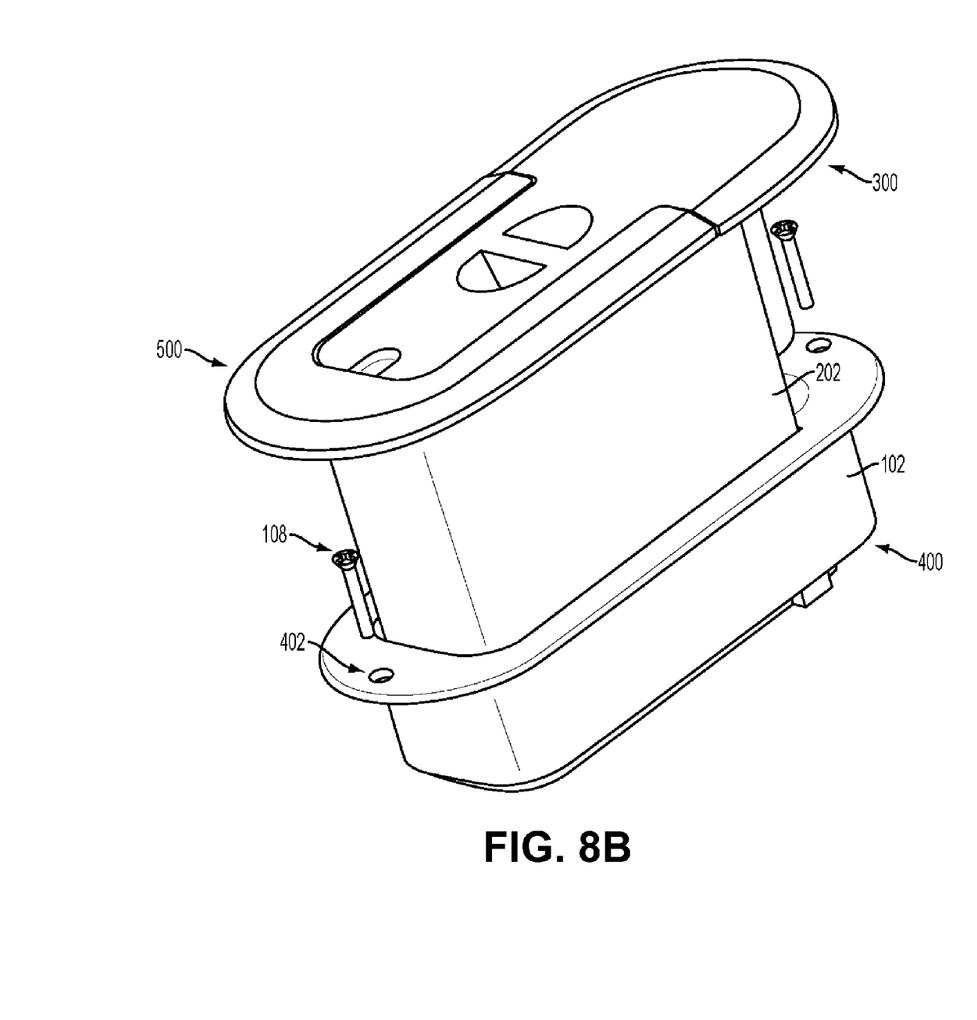
FIG. 8B provides a side perspective view of the deck grommet assembly with a raised body and a lid in a closed position according to another implementation described herein.

FIG. 8B provides a side perspective view of deck grommet assembly 10 with a raised grommet body and pivoting lid 300 in a closed position according to another implementation described herein. Referring to FIG. 8B, assembly 10 includes a liner 400, a grommet body 500, and pivoting lid 300.

Pivoting lid 300 may include features described above with respect to FIGS. 1-8A. Liner 400 may include features substantially similar to those described above with respect to liner 100. However, liner 400 may not include spacers 104 or aperture 110. Additionally, liner 400 may include apertures 402 through flange 106 to receive screws 108 in an orientation essentially perpendicular to deck surface 30.

Grommet body 500 may include features substantially similar to those described above with respect to body 200. However, body 400 may not include protrusion 206 to engage aperture 110. Additionally, stop 502 may replace stop 208. Similar to stop 208, stop 502 may be extend beyond the perimeter of wall 202 of body 500 to engage a bottom edge of wall 102 of line 400 when grommet body 500 is raised within liner 400. In one implementation, stop 502 may include a simple block. Alternatively, block 502 may include an integrated clip to releasably attach to the bottom edge of wall 102.

Figure 9:
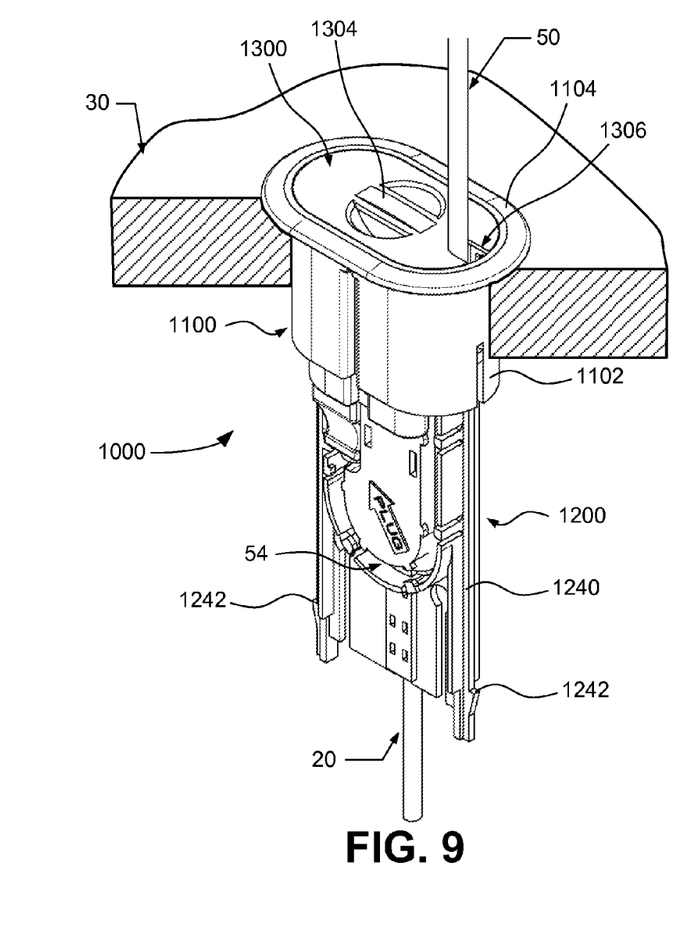
FIG. 9 provides a side perspective view of another deck grommet assembly with a lid in a closed position and cords inserted according to another implementation described herein.
Figure 10:
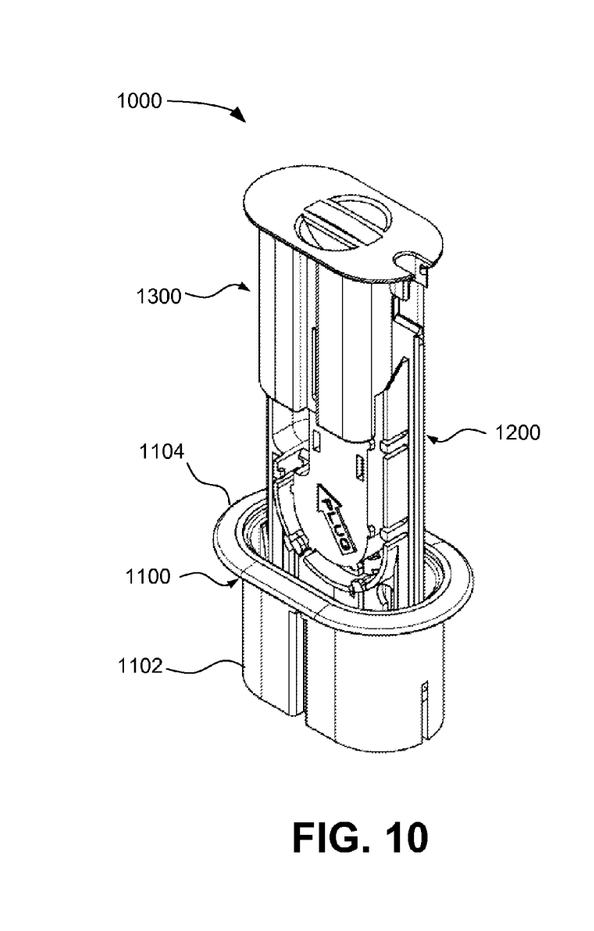
FIG. 10 provides a side perspective view of the deck grommet assembly of FIG. 9 with the lid in a partially open position.
Figure 11:
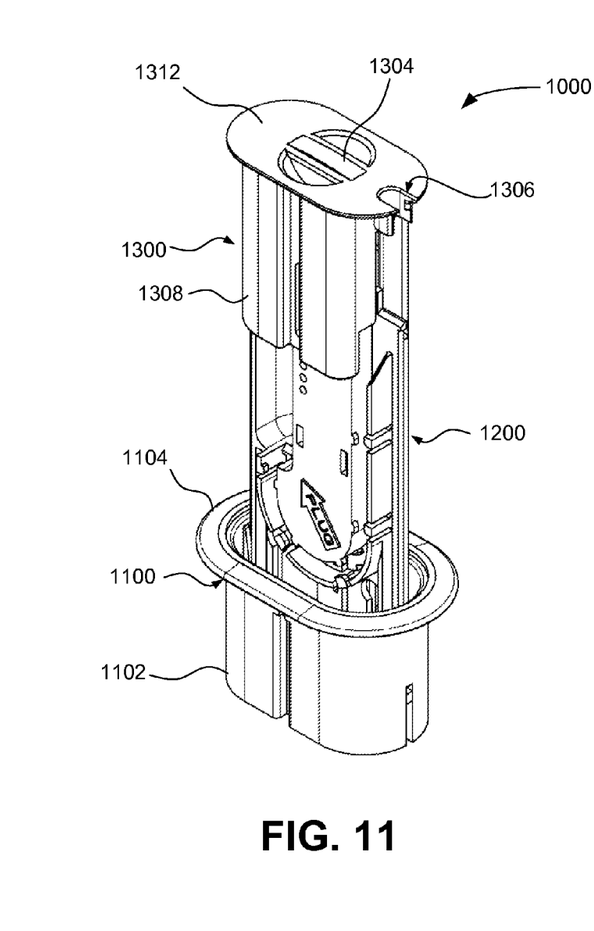
FIG. 11 provides a side perspective view of the deck grommet assembly of FIG. 9 with the lid in a fully open position.

FIG. 9 provides a side perspective view of another deck grommet assembly 1000 with cords inserted and a lid 1300 in a closed position according to another implementation described herein. FIG. 10 provides a side perspective view of deck grommet assembly 1000 with lid 1300 in a partially open position. FIG. 11 provides a side perspective view of deck grommet assembly 1000 with lid 1300 in a fully open position.

Referring collectively to FIGS. 9-11, generally, grommet assembly 1000 is configured to be inserted into a hole in deck surface 30 to secure a plug from electrical cord under deck surface 30. As shown in FIG. 9, assembly 1000 includes a liner 1100, a grommet body 1200, and a sliding lid 1300.

Liner 1100 may be secured to deck surface 30 within an opening in deck surface 30. Liner 1100 generally provides a tube-like structure through which grommet body 1200 may be raised/lowered. Liner 1100 may include wall 1102 that may be inserted into a corresponding opening in deck surface 30. A flange 1104 extending laterally from an upper edge of wall 1102 prevents insertion of liner 1100 (and grommet assembly 1000 generally) completely through the opening in deck surface 30. Similar to liner 100, screws 108 (FIG. 4) may be used to anchor liner 1100 to deck surface 30.

Grommet body 1200 may generally include a support structure in which to secure electrical cord 20 and the user's electrical cord 50. Grommet body 1200 may be raised/lowered within liner 1100 and may support sliding lid 1300. In implementations herein, grommet body 1200 may slide within liner 1100 to a partially open position, shown in FIG. 10. Sliding lid 1300 may additionally slide over grommet body 1200 to a fully open position, shown in FIG. 11.

Figure 12:
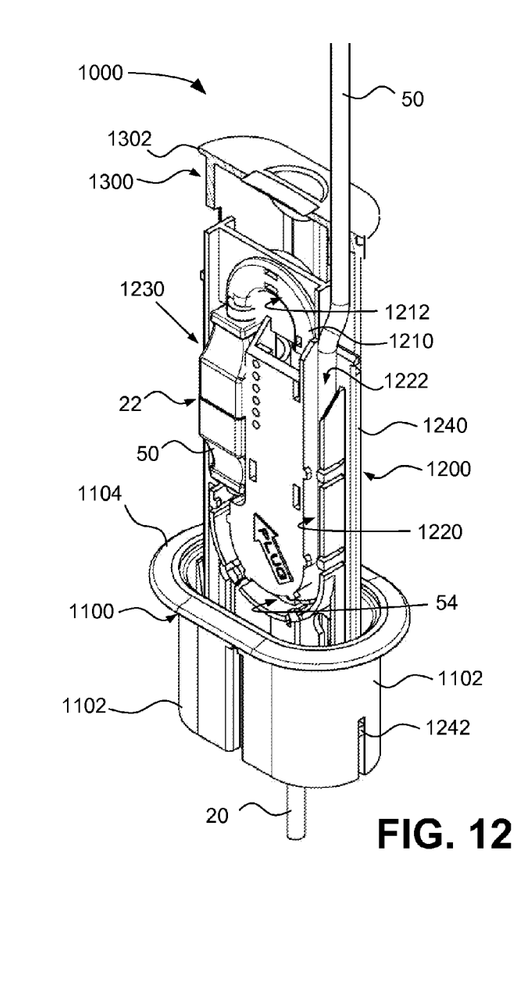
FIG. 12 provides a partial cutaway view of the deck grommet assembly of FIG. 9 with the lid in a fully open position and cords inserted.
Figure 13:
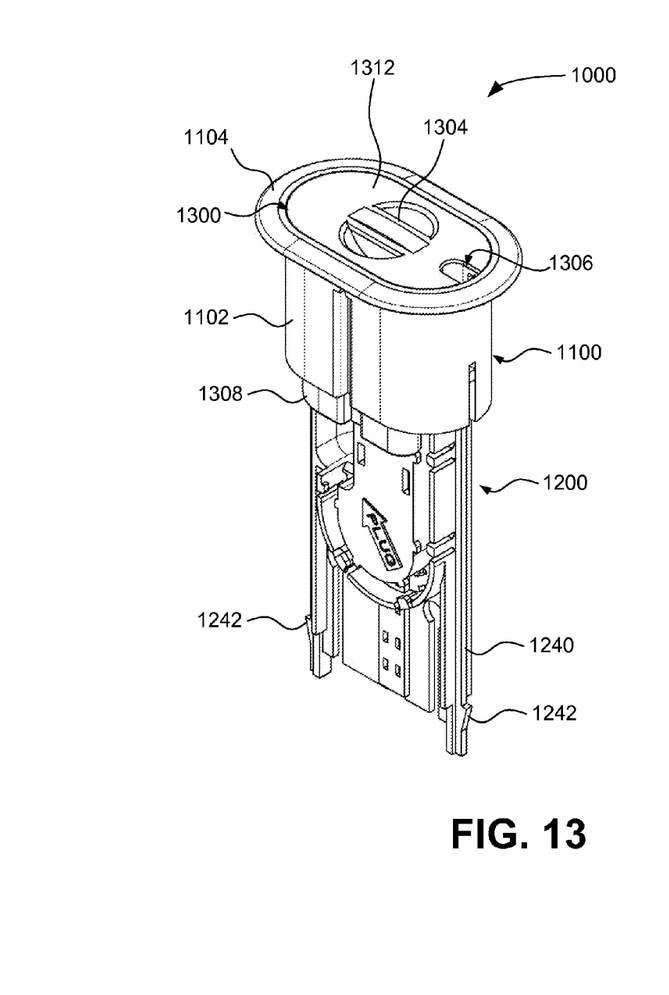
FIG. 13 provides a side perspective view of the deck grommet assembly of FIG. 9 with the lid in the closed position and no cords inserted.

FIG. 12 provides a partial cutaway view of deck grommet assembly 1000 with sliding lid 1300 in a fully open position and cords inserted. FIG. 13 provides a side perspective view of deck grommet assembly 1000 with lid 1300 in a closed position and no cords inserted. Referring to FIGS. 11-13, grommet body 1200 may include an inner cord channel 1210 and an outer cord channel 1220. Inner cord channel 1210 may include an opening to receive an electrical cord (e.g., electrical cord 20) fed from underneath deck surface 30. Electrical cord 20 may be secured within channel 1210 using tabs and/or clips. As shown in FIG. 12, inner cord channel 1210 may include a u-shaped bend 1212 to guide electrical cord 20 and position the face 22 of electrical cord 20 in a downward orientation.

Outer cord channel 1220 may include an opening 1222 to receive an electrical cord (e.g., user's electrical cord 50) from above deck surface 30. Opening 1222 may align with an exit port (e.g., exit port 1306, described below) of sliding lid 1300 to allow the user's electrical cord 50 to extend above deck surface 30. Inner cord channel 1210 and outer cord channel 1220 are configured to meet such that face 22 of electrical cord 20 and a male end of the user's electrical cord 50 can meet within a plug connection region 1230 of grommet body 1200.

Grommet body 1200 may include rails 1240 to guide movement of grommet body 1200 within liner 1100. Rails 1240 may slide within channels formed on the interior of liner 1100. Liner 1100 and grommet body 1200 may include a stop assembly to prevent grommet body 1200 from being completely removed from liner 1100. For example, rails 1240 may include stops 1242 extending laterally beyond the depth of rail 1240 to engage a bottom edge or slot of wall 1102 when grommet body 1200 is raised within liner 1100.

Sliding lid 1300 may include a flange 1302, a finger hold 1304, an exit port 1306, a wall 1308, and a top surface 1312. When sliding lid 1300 is in the closed position of FIG. 9, flange 1302 and top surface 1312 may be aligned in substantially the same plane as flange 1104. A top surface of flange 1104 and top surface 1312 may be sloped to allow liquid runoff from grommet assembly 1000. In one implementation, flange 1104 and top surface 1312 may generally form a convex facade to promote runoff.

Finger hold 1304 may include a recess and/or protrusion to allow a user to lift grommet body 1200 and sliding lid 1300 within liner 1100. Exit port 1306 may include a channel to allow the user's electrical cord 50 to exit deck grommet assembly 10.

Sliding lid 1300 may be inserted to fit over grommet body 1200 and within an opening of liner 1100. As shown in FIG. 10, liner 1100 is secured within an opening of deck surface 30, and grommet body 1200 can be lifted up from deck surfaced 30. As shown in FIG. 11, sliding lid 1300 can be raised further above grommet body 1200 in a telescoping effect. Deck grommet assembly 1000 may be positioned as shown in FIG. 11 by, for example, a user lifting up finger hold 1304.

Walls 1308 may extend downward from top portion 1312. A top edge of walls 1308 and the bottom of top portion 312 may meet to form a partial enclosure with an opening at the bottom edge of walls 1308. Wall 1308 may also include a side opening or discontinuity to permit insertion of electrical cord 50 when sliding lid 1308 is extended to the fully open position. The length of walls 1308 (e.g., from the top portion 1312 to the bottom opening) extend beyond the interface location of electrical cord 20 and the user's electrical cord 50 (e.g., within plug connection region 1230) when sliding lid is in a closed position. Thus, water seeping past the interface of liner 1100 and flange 1302 is prevented from creeping up to the cord interface.

Referring particularly to FIG. 12, the location of exit port 1306 and the shape of channel 1220 cause the user's electrical cord 50 to form a drip loop 54. Drip loop 54 prevents liquid that may enter exit port 1306 and run along electrical cord 50 from traveling up to female plug face 22.

Figure 14:
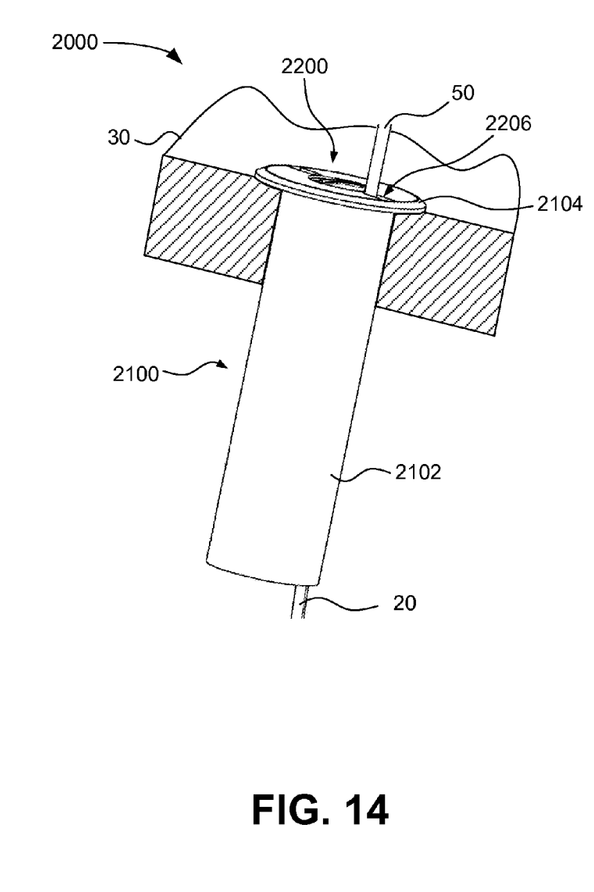
FIG. 14 provides a side perspective view of another deck grommet assembly with a lid in a closed position according to still another implementation described herein.
Figure 15:
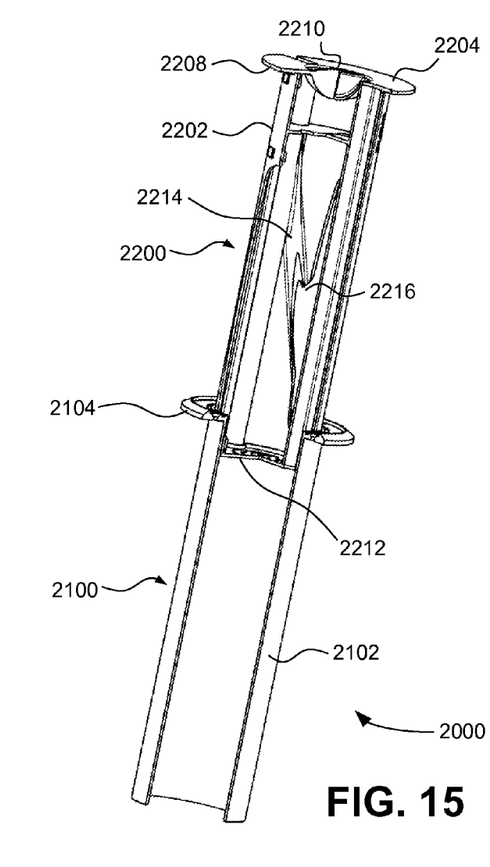
FIG. 15 provides a partial cutaway view of the deck grommet assembly of FIG. 14 with the lid in an open position and no cords inserted.
Figure 16:
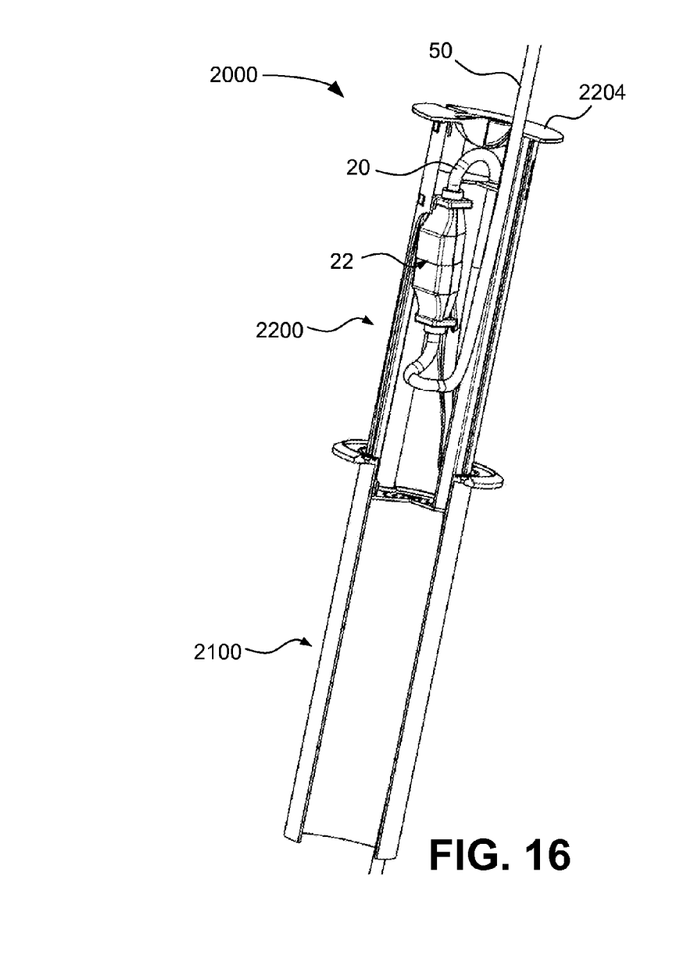
FIG. 16 provides a partial cutaway view of the deck grommet assembly of FIG. 14 with the lid in the open position and cords inserted.
Figure 17:
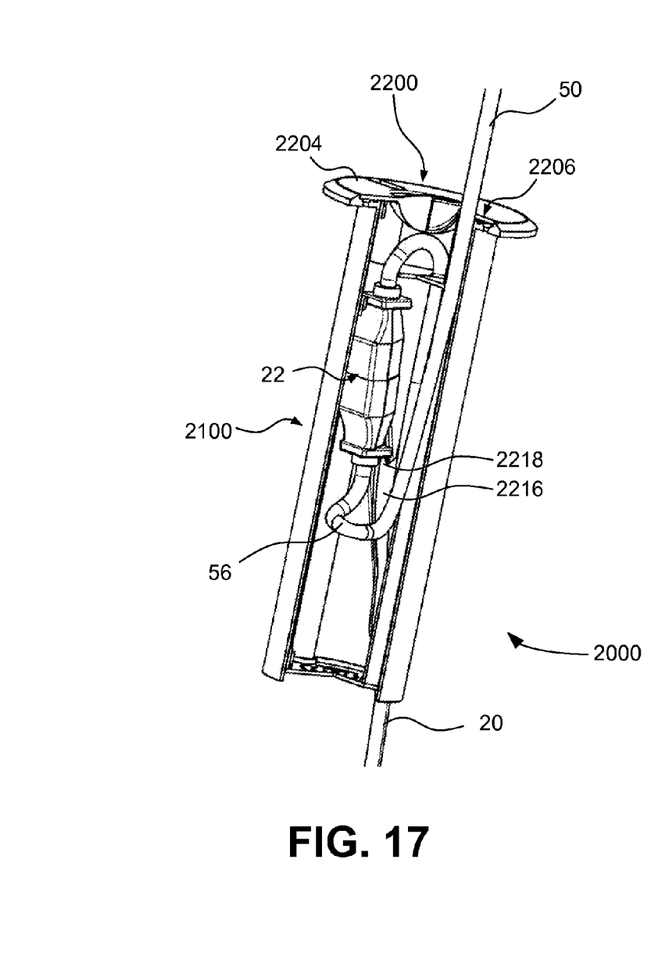
FIG. 17 provides a partial cutaway view of the deck grommet assembly of FIG. 14 with the lid in the closed position and cords inserted.

FIG. 14 provides a side perspective view of another deck grommet assembly 2000 with a grommet body 2200 in a closed position according to still another implementation described herein. FIG. 15 provides a partial cutaway view of deck grommet assembly 2000 with grommet body 2200 in an open position and no cords inserted. FIG. 16 provides a partial cutaway view of deck grommet assembly 2000 with grommet body 2200 in the open position and cords inserted. FIG. 17 provides a partial cutaway view of deck grommet assembly 2000 with the grommet body 2200 in the closed position and cords inserted. In one implementation, deck grommet assembly 2000 may include a smaller perimeter (e.g., than that of deck grommet assemblies 10 and 1000) to fit within a smaller hole of a deck surface (e.g., deck surface 30).

Referring collectively to FIGS. 14-17, generally, grommet assembly 2000 is configured to be inserted into a hole in deck surface 30 to secure a plug from an electrical cord under deck surface 30. As shown in FIGS. 14-17, deck grommet assembly 2000 includes a liner 2100 and a grommet body 2200.

Liner 2100 may be secured to deck surface 30 within an opening in deck surface 30. Liner 2100 provides a cylindrical structure through which grommet body 2200 may be raised/lowered. Liner 2100 may include a wall 2102 that may be inserted into a corresponding opening in deck surface 30. A flange 2104 extending laterally from an upper edge of walls 2102 prevents insertion of liner 2100 (and grommet assembly 2000 generally) completely through the opening in deck surface 30. In one implementation, flange 2104 may include a recess along an inner diameter to receive a flange (e.g., flange 2214 described below) of grommet body 2200. Similar to liner 100, screws 108 (FIG. 4) may be used to anchor liner 2100 to deck surface 30.

Grommet body 2200 may include a support structure in which to secure electrical cord 20 and the user's electrical cord 50. Grommet body 2200 may be raised/lowered within liner 2100. In implementations described herein, grommet body 2200 may slide within liner 2100 to an open position, shown in FIGS. 15 (without any electrical cords) and 16 (with electrical cord 20 and user's electrical cord 50 installed).

Referring to FIG. 15, grommet body 2200 may include a wall 2202; a top surface 2204 including an exit port 2206, a flange 2208, and a finger hold 2210; a bottom surface 2212; a female cord support 2214; and a male cord support 2216. Wall 2202 may generally form a tube-like channel with an opening in at least part of wall 2202 sufficient to provide access to female cord support 2214 and a mail cord support 2216 (e.g., when grommet body 200 is lifted to an open position above deck surface 30). Wall 2202 may be configured to form a slightly smaller diameter than an inside diameter of liner 2100.

Top surface 2204 may sit on a top edge of wall 2202 to close a top end of grommet body 2200 (e.g., with the exception of exit port 2206). Exit port 2206 may provide an opening in top surface 2204/flange 2208 and may provide a guide that extends along wall 2202 to allow the user's electrical cord 50 (e.g., that is plugged into extension cord 20) to exit deck grommet assembly 2000. Flange 2208 of top surface 2204 may extend laterally beyond the top edge of wall 2202 to prevent insertion of grommet body 2200 completely through liner 2100. In one implementation, flange 2208 may engage a portion of flange 2104 when grommet body 200 is in a closed position below deck surface 30. In another implementation (not shown), flange 2208 may extend to cover flange 2104 and contact deck surface 30 when grommet body 2200 is in a closed position. Top surface 2204 may also include a finger hold 2210. Finger hold 2210 may include a recess and/or protrusion to allow a user to lift grommet body 2200 within liner 2100.

Bottom surface 2212 may include an opening to allow extension cord 20 to be fed from under deck surface 30 and secured within grommet body 2200. Bottom surface 2212 may also include one or more holes or slots to prevent collection of water.

Female cord support 2214 may include a retention member to secure a female end of extension cord 20 within grommet body 2200 and guide extension cord 20 through the opening in bottom surface 2212. In one implementation, the female end of extension cord 20 is secured by female cord support 2214 within grommet body 2200 so that face 22 of extension cord 20 is angled downward from top surface 2204.

Male cord support 2216 may include a retention member to secure a male end of the user's electrical cord 50 that is connected to the female end of extension cord 20 within grommet body 2200. Male cord support 2216 may include a tab or clip 2218 to support the male plug of the user's electrical cord 50, which, in turn may support the female plug of extension cord 20 when the two cords are connected. In one implementation, male cord support 2216 may guide the user's electrical cord 50 through the exit port 2206 in top surface 2204.

Referring particularly to FIG. 17, the location of exit port 2206 and the shape of male cord support 2216 cause the user's electrical cord 50 to form a drip loop 56. Drip loop 56 prevents liquid that may enter exit port 2206 and run along electrical cord 50 from traveling up to female plug face 22.

In one implementation, liner 2100 and grommet body 2200 may include interlocking channels, stops, and/or other types of guides to permit and/or control movement of grommet body 2200 within liner 2100. For example, similar to the configuration shown in FIGS. 1-8, liner 2100 and grommet body 2200 may include a latching mechanism to hold grommet body 2200 in a raised position and a stop assembly to prevent grommet body 2200 from being completely removed from liner 2100.

Implementations described herein provide a grommet assembly, installed in a hole in a deck surface, to secure an electrical cord. The female plug of the electrical cord may be fed in from under a deck surface and secured within the grommet assembly. A user may lift up the grommet body/lid to expose the face of the female plug. A user's electrical cord from above the deck surface may be connected to the female plug and extend out an exit port in the grommet assembly. The grommet assembly may be lowered into the hole in the deck surface. When lowered, the face of the female plug may be positioned in a downward orientation and the user's electrical cord may form a drip loop to prevent water from running to the female plug.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments. For example, while implementations have been shown to include one female plug within grommet assemblies 10, 1000, and 2000, in other implementations, two or more female plugs may be included.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:
1. A grommet assembly, comprising:
a liner configured to be secured within a hole in a deck surface;
a grommet body including one or more walls forming a u-shaped channel, wherein the grommet body moves longitudinally within the liner between an extended position substantially above the liner and a withdrawn position substantially below the liner; and a lid attached to the one or more walls of the grommet body, within the u-shaped channel, in a pivoting configuration, wherein the lid includes a retainer to secure a plug of an outdoor electrical cord fed through the liner from under the deck surface, and wherein the lid pivots between a closed position and an open position that permits access to the plug from above the deck surface when the grommet body is in the extended position.

2. The grommet assembly of claim 1, wherein the lid further comprises an exit port, for another electrical cord above the deck surface, to enable the lid to return to the closed position when the other electrical cord is connected to the plug.

3. The grommet assembly of claim 2, wherein the lid is further configured to position the other electrical cord with a drip loop that prevents liquid on the other electrical cord from reaching the plug.

4. The grommet assembly of claim 1, wherein the lid further comprises a wall extending downward from an underside of the lid, and wherein the wall fits inside the grommet body and pivots with the lid.

5. The grommet assembly of claim 4, wherein the wall extends lower than a face of the plug when the plug is installed in the grommet assembly and the lid is in the closed position.

6. The grommet assembly of claim 1, wherein the lid secures the plug so that a face of the plug is angled substantially downward when the lid is in the closed position.

7. The grommet assembly of claim 4, wherein the lid includes a flange, extending laterally beyond a top of the wall, that engages the liner and prevents the lid from pivoting when the grommet body is in the withdrawn position.

8. The grommet assembly of claim 1, wherein the lid further comprises a finger hold to enable a user to lift the grommet body to the extended position and to pivot the lid to the open position.

9. The grommet assembly of claim 8, wherein the lid returns to the closed position when the finger hold is released and no other electrical cord is connected to the plug.

10. A grommet assembly, comprising:
a liner configured to be secured within a hole in a deck surface, wherein the liner includes channels formed on an interior of the liner;
a grommet body including rails that slide within the channels such that the grommet body moves longitudinally within the liner between an extended position, with the grommet body substantially above the liner, and a withdrawn position, with the grommet body substantially below the liner, wherein the grommet body includes an inner cord channel to secure, to the grommet body, a plug of an outdoor electrical cord fed through the liner from under the deck surface, and wherein the inner cord channel secures the plug so that a face of the plug is angled substantially downward in both the extended position and the withdrawn position to prevent water from running into the plug; and a lid attached to the grommet body in an overlapping configuration to fit over the grommet body and within the liner, wherein the lid is configured to slide longitudinally between a closed position and an open position that permits access to the plug from above the deck surface when the grommet body is in the extended position.

11. The grommet assembly of claim 10, wherein the lid further comprises an exit port, for another electrical cord above the deck surface, to enable the lid to return to the closed position when the other electrical cord is connected to the plug.

12. The grommet assembly of claim 11, wherein the grommet body is further configured to position the other electrical cord with a drip loop that prevents liquid that enters the exit port on the other electrical cord from reaching the plug.

13. The grommet assembly of claim 10, wherein the lid further comprises a finger hold to enable a user to lift the grommet body to the extended position and the lid to the open position.

14. The grommet assembly of claim 13, wherein the lid is further configured to return to the closed position when the finger hold is released and no other electrical cord is connected to the plug.

15. A grommet assembly, comprising:
a liner configured to be secured within a hole in a deck surface; and
a grommet body including a wall forming a tube-like structure, wherein the grommet body moves longitudinally within the liner between an extended position substantially above the liner and a withdrawn position substantially below the liner,
wherein the grommet body includes a female cord support to secure, to the grommet body, a plug of an electrical cord fed through the liner from under the deck surface,
wherein the female cord support secures the plug so that a face of the plug is angled substantially downward in both the extended position and the withdrawn position to prevent water from running into the plug, and
wherein the grommet body includes an opening that permits access to the plug from above the deck surface when the grommet body is in the extended position.

16. The grommet assembly of claim 15, wherein the grommet body further comprises an integrated lid with an exit port, for another electrical cord above the deck surface, to enable the lid to return to the withdrawn position when the other electrical cord is connected to the plug.

17. The grommet assembly of claim 16, wherein the grommet body is further configured to position the other electrical cord with a drip loop that prevents liquid that enters the exit port on the other electrical cord from reaching the plug.

18. The grommet assembly of claim 15, wherein the grommet assembly further comprises a latch assembly to hold the grommet body in the extended position.

* * * * *